(12) United States Patent
Hirayama et al.

(10) Patent No.: US 7,295,235 B2
(45) Date of Patent: Nov. 13, 2007

(54) SOLID-STATE IMAGE PICKUP DEVICE

(75) Inventors: Satoshi Hirayama, Kanagawa (JP); Yasuhiro Sekine, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 769 days.

(21) Appl. No.: 10/663,767

(22) Filed: Sep. 17, 2003

(65) Prior Publication Data

US 2004/0105022 A1   Jun. 3, 2004

(30) Foreign Application Priority Data

Sep. 20, 2002   (JP)   ............................. 2002-275949

(51) Int. Cl.
*H04N 3/14*   (2006.01)
*H04N 5/225*   (2006.01)
(52) U.S. Cl. ...................... 348/274; 348/340
(58) Field of Classification Search ........ 348/272–275, 348/280, 335, 340; 438/29, 31, 69; 257/432, 257/294
See application file for complete search history.

(56) References Cited

U.S. PATENT DOCUMENTS

| | | | |
|---|---|---|---|
| 5,561,317 A | 10/1996 | Momma et al. | 257/620 |
| 5,731,131 A | 3/1998 | Momma et al. | 430/311 |
| 5,976,907 A * | 11/1999 | Shigeta et al. | 438/65 |
| 6,271,900 B1 * | 8/2001 | Li | 349/95 |
| 6,407,415 B2 * | 6/2002 | Lee | 257/215 |
| 6,765,277 B2 * | 7/2004 | Chen et al. | 257/459 |

FOREIGN PATENT DOCUMENTS

| | | |
|---|---|---|
| JP | 5-6849 | 1/1993 |
| JP | 10-209410 | 7/1998 |
| JP | 10-209410 | 8/1998 |

* cited by examiner

*Primary Examiner*—Lin Ye
*Assistant Examiner*—Justin P Misleh
(74) *Attorney, Agent, or Firm*—Fitzpatrick, Cella Harper & Scinto

(57) ABSTRACT

A solid-state image pickup device includes a photoelectric conversion portion for generating signal electric charges in accordance with an amount of incident light, a plurality of color filters, and a flattening layer formed on the plurality of color filters. A thickness of a projection or a recess on a surface of the flattening layer, provided on a region where color filters are adjacent to each other, is equal to or less than 0.2 μm.

6 Claims, 5 Drawing Sheets

FIRST EXPOSURE REGION
15

14 SOLID-STATE IMAGE PICKUP DEVICE

16
SECOND EXPOSURE REGION

SOLID-STATE IMAGE PICKUP DEVICE

BACKGROUND OF THE INVENTION

1. Field of the Invention

The present invention relates to a solid-state image pickup device including color filters for photographing a color image.

2. Description of the Related Art

A configuration shown in FIG. 4 has been known for a conventional solid-state image pickup device used in a color video camera, a color still-image camera, or the like.

FIG. 4 is a side cross-sectional view illustrating the structure of a pixel of the conventional solid-state image pickup device, in which a photoelectric conversion portion 2 for generating signal electric charges in accordance with the amount of incident light is provided at a portion near the surface of a semiconductor substrate 1. The photoelectric conversion portion 2 is provided for each of a plurality of pixels arranged in the form of a grid. An active device (not shown) is formed on the semiconductor substrate 1 together with the photoelectric conversion portion 2.

A first interlayer insulating film 3, for example, made of $SiO_2$ having an aperture facing the photoelectric conversion portion 2 is deposited on the semiconductor substrate 1, and a first wiring 4 obtained by patterning an Al (aluminum) film or the like to a desired shape is formed on the first interlayer insulating film 3. A second interlayer insulating film 5, a second wiring 6, a third interlayer insulating film 7, and a third wiring 8 are sequentially formed on the first interlayer insulating film 3 in accordance with a circuit pattern.

These interlayer insulating films and wirings do not necessarily have a three-layer structure, but may have a two-layer structure, a single-layer structure or a structure having at least four layers.

A protective film 9, for example, made of SiON is deposited on the third interlayer insulating film 7 so as to cover also the third wiring 8. A first flattening layer 10, for example, made of acrylic resin is deposited on the protective film 9.

A color filter 11 for performing color separation for incident light in accordance with respective pixels is provided on the first flattening film 10. The color filter 11 is formed using a photoresist including pigments of three primary colors, i.e., red (R), green (G) and blue (B).

A second flattening layer 12 having a light transmitting property is deposited on the color filters 11, and a microlens 13, serving as a condenser lens for condensing incident light onto the photoelectric conversion portion 2, is formed on the second flattening layer 12.

As described in Japanese Patent Application Laid-Open (Kokai) No. 5-6849 (1993), in a solid-state image pickup device having a large chip size, since a pattern forming region is larger than an exposable range at a single exposure operation by an exposure apparatus, divided exposure is adopted in which the pattern forming region is divided into a plurality of exposure regions, and a desired pattern is formed by combining divided patterns.

In recent solid-state image pickup devices, a case in which adjacent color filters are formed in an overlapped state or a case in which a gap is produced between adjacent color filters sometimes occurs due to variations in the sizes of color filters or deviations in the positions of color filters as a result of large-scale integration. Furthermore, since corner portions of a color filter have a circular shape due to insufficient resolution of an exposure apparatus, a space where a color filter is not formed is produced at such a corner portion. For example, as disclosed in Japanese Patent Application Laid-Open (Kokai) No. 10-209410 (1998), in order to prevent overlap of color filters and a gap between color filters, there is a method of removing a gap between adjacent color filters by sequentially superposing three types of color filters and then removing upper color filters until the lowermost color filter is exposed.

In this method, however, it is impossible to adjust the thickness of each of the R, G and B color filters in order to adjust differences in light transmittance. Furthermore, it is very difficult to perform a process of removing color filters by performing uniform etching over a large area.

FIG. 5 assumes a case of forming a solid-state image pickup device 14 by dividing it into two exposure regions, i.e., a first exposure region 15 and a second exposure region 16. In this case, as shown in FIGS. 6A and 6B, the amount of overlap and the size of a gap between color filters due to deviations in the positions of color filters sometimes differ between the first exposure region 15 and the second exposure region 16.

In such a case, the surface of the second flattening layer formed on the color filters is not sufficiently flattened, resulting in the formation of projections or recesses at overlapped portions or gap portions among color filters.

For example, as shown in FIGS. 7A and 7B, recesses in the second flattening layer produced at gap portions between color filters disperse incident light by operating in the same manner as lenses. As a result, light passing through a color filter reaches a photoelectric conversion portion, resulting in variations in the amount of incident light among pixels. Furthermore, since light passing through a gap between color filters sometimes reaches a photoelectric conversion portion by being reflected by wirings or the like, a photographed image degrades.

When color filters overlap, the amount of incident light reaching a photoelectric conversion portion decreases because incident light passes through thick color filters, and variations in the amount of incident light occur among pixels.

Particularly, when forming color filters according to the above-described divided exposure, then, as shown in FIGS. 7A and 7B, since the amount of overlap of color filters or the amount of a gap between color filters differ between the first exposure region and the second exposure region, the height of a projection or a recess produced on the surface of the second flattening layer also differs. As a result, pronounced variations in the amount of incident light appear in a photographed image.

SUMMARY OF THE INVENTION

It is an object of the present invention to solve the above-described problems in the prior art.

It is another object of the present invention to provide a solid-state image pickup device in which degradation of a photographed image is prevented by suppressing variations in the amount of light incident upon a photoelectric conversion portion.

According to one aspect, the present invention which achieves the above-described objects relates to a solid-state image pickup device including a photoelectric conversion portion for generating signal electric charges in accordance with an amount of incident light, a plurality of color filters, and a flattening layer formed on the plurality of color filters to a thickness so that a projection or a recess on a surface of the flattening layer generated by overlap of adjacent color filters or a gap between adjacent color filters does not influence a photographed image.

It is desirable that a thickness, that is a height or depth of the projection or the recess, on the surface of the flattening layer is equal to or less than 0.2 μm.

According to another aspect, the present invention relates to a solid-state image pickup device including a photoelectric conversion portion for generating signal electric charges in accordance with an amount of incident light, a plurality of color filters, and a condenser lens, having a shape to cause the incident light to pass through a region of a color filter having a uniform spectral characteristic, for condensing the incident light onto the photoelectric conversion portion.

It is desirable that the condenser lens has a shape to cause the incident light to pass through a region of a color filter having a uniform thickness, and that the condenser lens has a shape to cause an outermost optical path of the incident light to coincide with a surface of the color filter facing the condenser lens, at an inner position of 0.1 L-0.25 L from the edges of a pixel, where L represents a pixel diameter.

The solid-state image pickup device may further include a wiring layer formed between the photoelectric conversion portion and the plurality of color filters, wherein the wiring layer includes a wiring disposed so as not to cross an outermost optical path of the incident light.

The plurality of color filters may be formed according to divided exposure in which the solid-state image pickup device is divided into a plurality of exposure regions, and the color filters may be formed using a divided exposure method in which a desired pattern is formed by combining patterns of the divided exposure regions.

In the solid-state image pickup device having the above-described configuration, by providing a flattening layer formed on the plurality of color filters to a thickness so that a projection or a recess on a surface of the flattening layer generated by overlap of adjacent color filters or a gap between adjacent color filters does not influence a photographed image, variations in the amount of incident light onto the photoelectric conversion portion due to the shape of the flattening layer are reduced, resulting in reduction of variations in the amount of incident light among pixels. In addition, by providing a condenser lens, having a shape to cause the incident light to pass through a region of a color filter having a uniform spectral characteristic, variations in the amount of incident light on the photoelectric conversion portion due to the characteristics of the color filters are reduced, resulting in reduction of variations in the amount of incident light among pixels.

DESCRIPTION OF THE PREFERRED EMBODIMENTS

The present invention will now be described with reference to the drawings.

Figure 1:
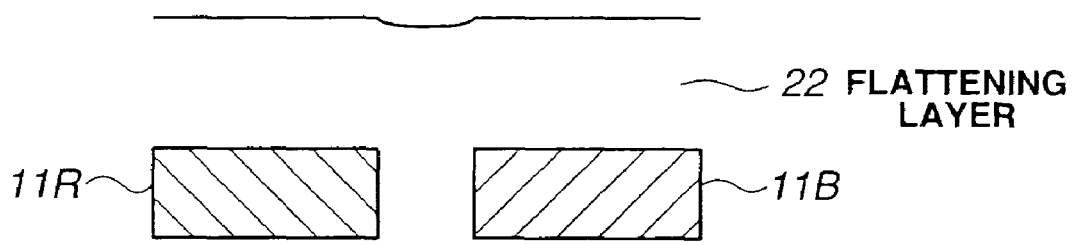
FIG. 1 is a side cross-sectional view illustrating the configuration of a solid-state image pickup device according to a first embodiment of the present invention.
Figure 2:
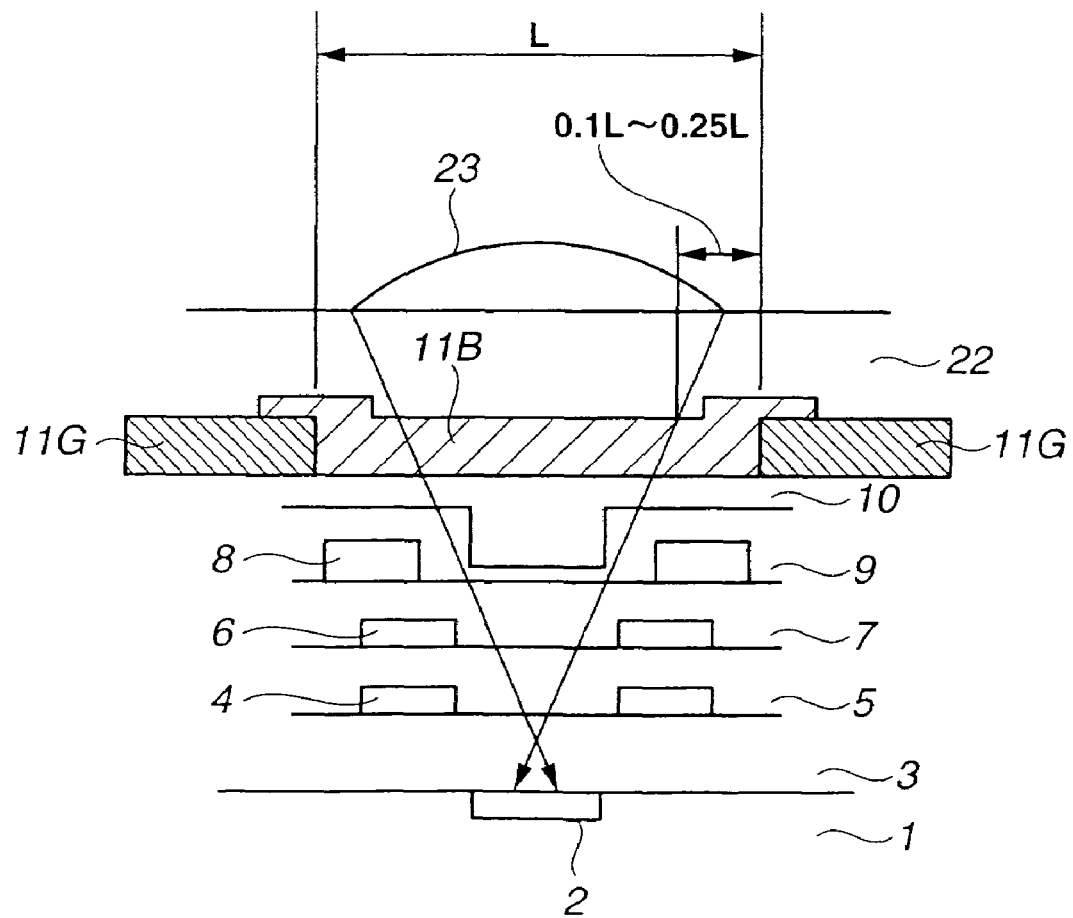
FIG. 2 is a side cross-sectional view illustrating the configuration of a solid-state image pickup device according to a second embodiment of the present invention.

FIG. 1 is a side cross-sectional view illustrating the configuration of a solid-state image pickup device according to a first embodiment of the present invention. FIG. 2 is a side cross-sectional view illustrating the configuration of a solid-state image pickup device according to a second embodiment of the present invention.

As shown in FIG. 1, in the solid-state image pickup device of the first embodiment, a second flattening layer 22 deposited on a color filter 11 is formed to be thicker than in the conventional case, so that the amount of a projection or a recess produced on the surface of the second flattening layer 22 is sufficiently small. More specifically, the thickness of the second flattening layer 22 is set so that the height or depth of a projection or a recess produced on the surface of the second flattening layer 22 is equal to or less than 0.2 μm.

In this configuration, since variations in the amount of incident light onto a photoelectric transducer 2 due to the shape of the second flattening layer 22 are reduced, variations in the amount of incident light among pixels are reduced, thereby preventing degradation of a photographed image.

In the solid-state image pickup device of the second embodiment, the shape of a microlens 23 is set so that incident light onto a photoelectric conversion portion does not pass through an overlapped portion of color filters. More specifically, as shown in FIG. 2, the diameter and the thickness of the microlens 23 are set so that an outermost optical path of the incident light coincides with the upper surface of a color filter 11, at an inner position of 0.1 L-0.25 L from the edges of a pixel, where L represents a pixel diameter.

In this configuration, since variations in the amount of incident light onto a photoelectric conversion portion 2 due to the characteristic of the color filter 11 are reduced, variations in the amount of incident light among pixels are reduced, thereby preventing degradation of a photographed image.

Particularly, if the configuration of the first or second embodiment is applied to a solid-state image pickup device in which color filters are formed using divided exposure, since variations in the amount of incident light between divided regions are reduced, degradation of a photographed image is further prevented.

Figure 4:
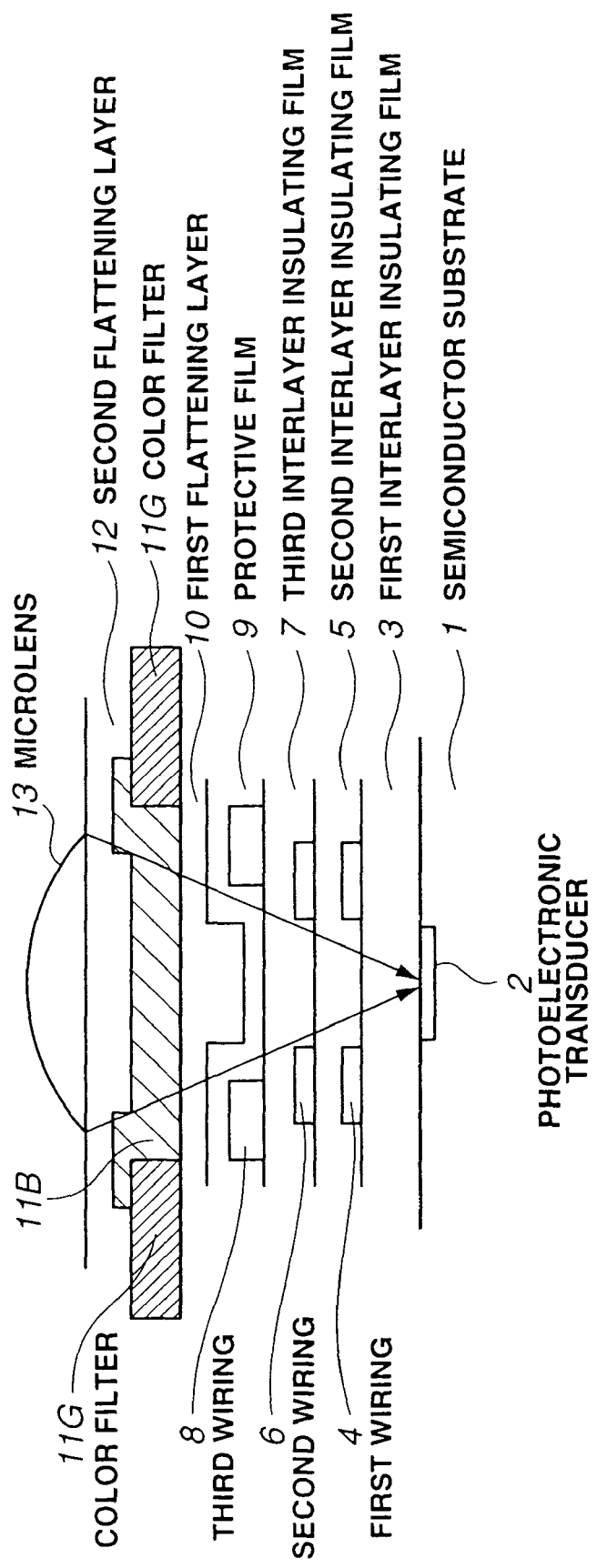
FIG. 4 is a side cross-sectional view illustrating the configuration of a conventional solid-state image pickup device.
Figure 5:
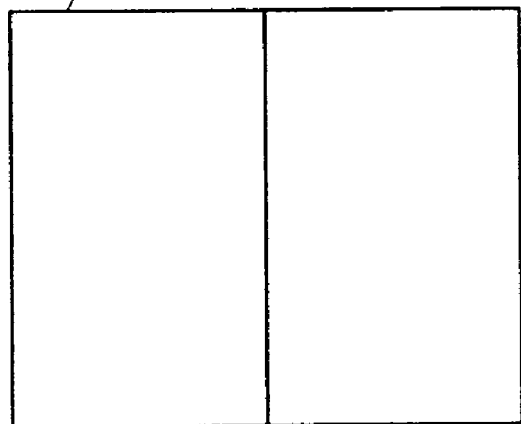
FIG. 5 is a plan view illustrating a solid-state image pickup device subjected to divided exposure.
Figure 6A:
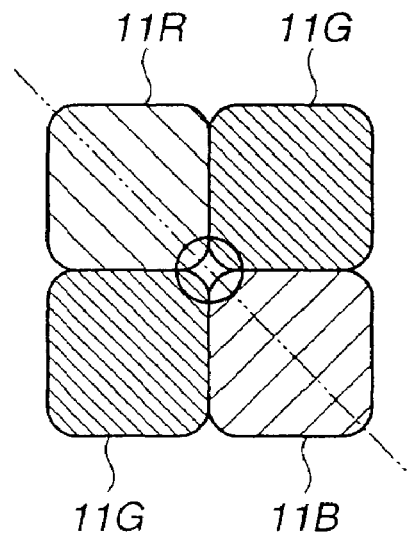
FIGS. 6A and 6B are plan views, each illustrating position deviation among color filters of the solid-state image pickup device shown in FIG. 5.
Figure 6B:
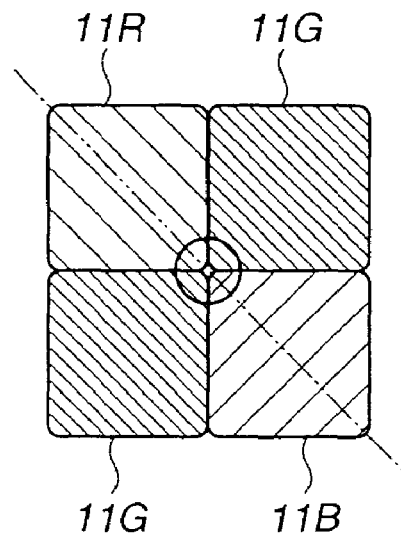
Figure 7A:
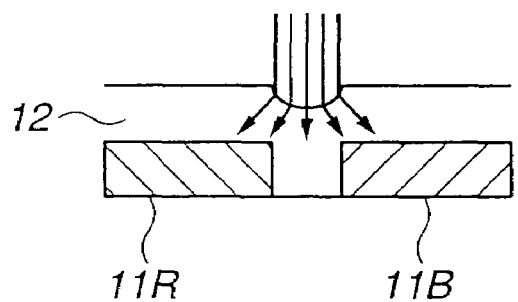
FIGS. 7A and 7B are side cross-sectional views, each illustrating position deviation between color filters of the solid-state image pickup device shown in FIG. 5.
Figure 7B:
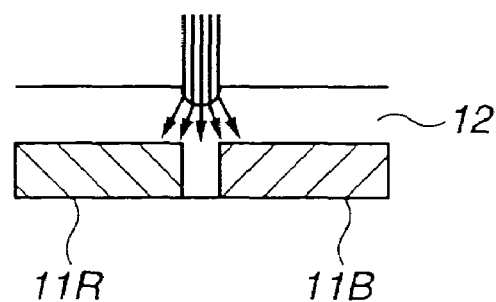

Since other components are the same as in the conventional solid-state image pickup device shown in FIG. 4, further description thereof will be omitted. In FIGS. 1 and 2, the same components as those in the conventional device are indicated by the same reference numerals.

Although in FIGS. 1 and 2, the microlens 23 and the color filter 11 are separately provided, the microlens 23 may have the function of the color filter 11.

Next, a description will be provided of a specific method for manufacturing the solid-state image pickup device of the first embodiment with reference to the drawings.

Usually, PGMA (polyglycidyl methacrylate), PMMA (polymethyl methacrylate), polyimide or the like is used as a material for the second flattening layer 22 formed on the color filter 11 shown in FIG. 1.

Figure 3:
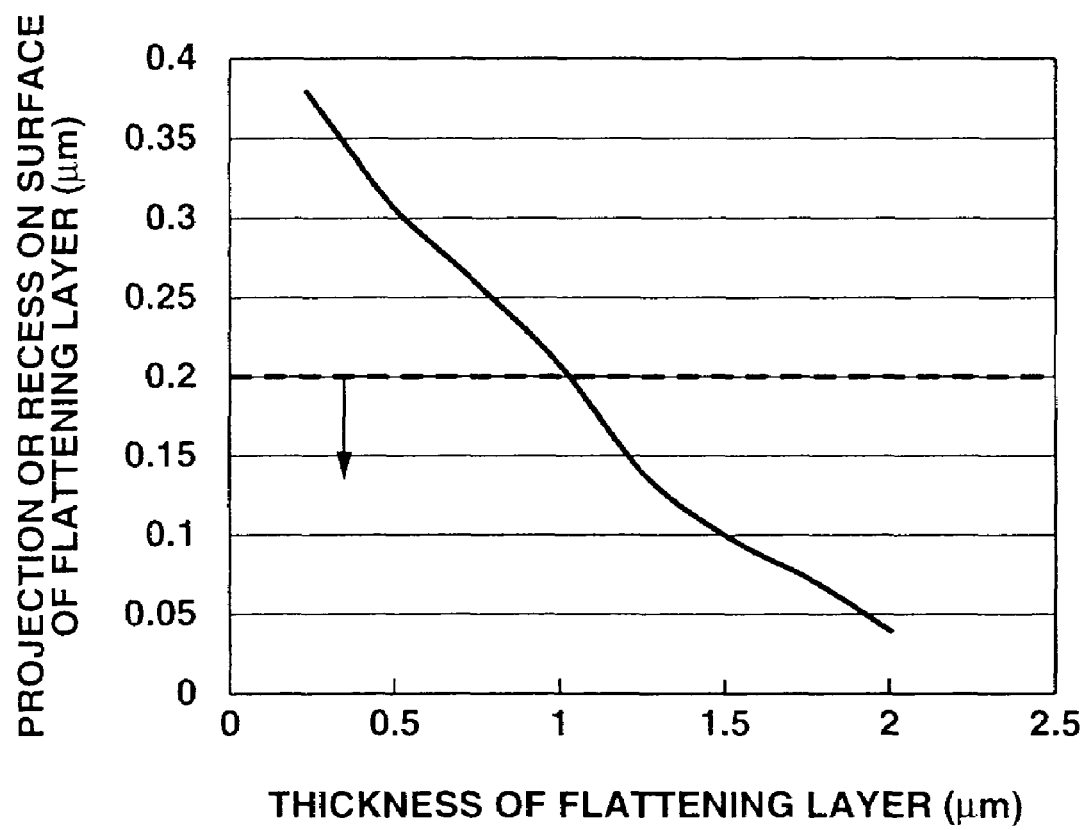
FIG. 3 is a graph illustrating the relationship between the height or depth of a projection or a recess produced on the surface of a second flattening layer and the thickness of the second flattening layer.

In the first embodiment, solid-state image pickup devices in which the respective second flattening layers 22 have thicknesses of 0.5 µm, 1.0 µm and 1.5 µm were formed. At that time, the depths of recesses produced on the respective second flattening layers 22 were 0.31 µm, 0.21 µm and 0.10 µm. FIG. 3 illustrates the relationship between the height or depth of the projection or the recess produced on the surface of the second flattening layer 22 and the thickness of the second flattening layer 22. The refractive index nD of the second flattening layer 22 used in the first embodiment was 1.55.

Microlenses 23 were formed on the respective second flattening layers 22 having the different thicknesses, to provide three types of solid-state image pickup devices. The structure from the semiconductor substrate 1 to the color filter 11 including wirings and interlayer insulating films are the same as in the conventional configuration shown in FIG. 4.

Photographing operations were performed using the above-described image pickup devices. It was confirmed that a voltage difference between pixel signals from adjacent exposure regions formed by divided exposure causes no problems in the picture quality if the projection or the recess on the second flattening layer 22 is set to be equal to or less than 0.2 µm within a pixel region. That is, the thickness of the second flattening layer 22 may be set to at least 1.0 µm.

Since the present invention has the above-described configuration, the following effects are obtained.

By providing a flattening layer formed on a plurality of color filters to a thickness so that a projection or a recess on a surface of the flattening layer generated by overlap of adjacent color filters or a gap between adjacent color filters does not influence a photographed image, variations in the amount of incident light on the photoelectric conversion portion due to the shape of the flattening layer are reduced, resulting in reduction of variations in the amount of incident light among pixels, and prevention of degradation of a photographed image. In addition, by providing a condenser lens, having a shape to cause the incident light to pass through a region of a color filter having a uniform spectral characteristic, variations in the amount of incident light on the photoelectric conversion portion due to the characteristics of the color filters are reduced, resulting in reduction of variations in the amount of incident light among pixels, and prevention of degradation of a photographed image.

Particularly, in the configuration in which color filters are formed according to divided exposure, since variations in the amount of incident light between divided regions are reduced, degradation of a photographed image is more effectively prevented.

The individual components shown in outline in the drawings are all well known in the solid-state image pickup device arts and their specific construction and operation are not critical to the operation or the best mode for carrying out the invention.

While the present invention has been described with respect to what are presently considered to be the preferred embodiments, it is to be understood that the invention is not limited to the disclosed embodiments. To the contrary, the present invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A solid-state image pickup device comprising:
    a photoelectric conversion portion, configured to generate signal electric charges in accordance with an amount of incident light, comprising first and second exposure regions;
    a plurality of color filters comprising:
        two adjacent color filters in the first exposure region forming a gap therebetween or overlapping each other;
        two adjacent color filters in the second exposure region forming a gap therebetween or overlapping each other; and
    a flattening layer formed on said plurality of color filters,
    wherein a recess is formed on a surface of the flattening layer in the first exposure region in the event the two adjacent color filters in the first exposure region form a gap therebetween,
    wherein a projection is formed on a surface of the flattening layer in the first exposure region in the event the two adjacent color filters in the first exposure region overlap each other,
    wherein a recess is formed on a surface of the flattening layer in the second exposure region in the event the two adjacent color filters in the second exposure region form a gap therebetween,
    wherein a projection is formed on a surface of the flattening layer in the second exposure region in the event the two adjacent color filters in the second exposure region overlap each other,
    wherein the thickness of the projections and recesses formed on the surface of the flattening layer in the first and second exposure regions is equal to or less than 0.2 µm,
    wherein said flattening layer reduces the variation in the amount of incident light reaching the first and second exposure regions arising from differences in the gaps or overlapping of adjacent color filters in the first and second exposure regions.

2. A solid-state image pickup device according to claim 1, wherein a thickness of said flattening layer is at least 1.0 µm.

3. A solid-state image pickup device according to claim 1, wherein said flattening layer comprises an organic material.

4. A solid-state image pickup device comprising:
    a photoelectric conversion portion configured to generate signal electric charges in accordance with an amount of incident light comprising first and second exposure regions;
    a plurality of color filters comprising:
        two adjacent color filters in the first exposure region overlapping each other;
        two adjacent color filters in the second exposure region overlapping each other; and
    a condenser lens, having a shape to cause the incident light to avoid passing through regions of the color filters in which the two adjacent color filters in the first exposure region overlap each other and in which the two adjacent color filters in the second exposure region overlap each other, so as to pass through regions of the color filters having a uniform spectral characteristic, for condensing the incident light onto said photoelectric conversion portion.

5. A solid-state image pickup device according to claim 4, wherein said condenser lens has a shape to cause the incident light to pass through a region of a color filter having a uniform thickness.

6. A solid-state image pickup device according to claim 4, further comprising a wiring layer formed between said photoelectric conversion portion and said plurality of color filters, wherein said wiring layer includes a wiring disposed so as not to cross an outermost optical path of the incident light.

* * * * *